US010422489B2

United States Patent
Inoue et al.

(10) Patent No.: US 10,422,489 B2
(45) Date of Patent: Sep. 24, 2019

(54) LIGHTING DEVICE WITH DIVERGENT REFLECTION SURFACES BETWEEN EXCITATION LIGHT SOURCES AND FLUORESCENT PLATE

(71) Applicant: Ushio Denki Kabushiki Kaisha, Tokyo (JP)

(72) Inventors: Masaki Inoue, Tokyo (JP); Osamu Osawa, Tokyo (JP)

(73) Assignee: Ushio Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/765,851

(22) PCT Filed: Sep. 8, 2016

(86) PCT No.: PCT/JP2016/076442
§ 371 (c)(1),
(2) Date: Apr. 4, 2018

(87) PCT Pub. No.: WO2017/061227
PCT Pub. Date: Apr. 13, 2017

(65) Prior Publication Data
US 2018/0283625 A1    Oct. 4, 2018

(30) Foreign Application Priority Data

Oct. 6, 2015 (JP) ................. 2015-198280

(51) Int. Cl.
*F21V 9/38* (2018.01)
*F21S 2/00* (2016.01)
(Continued)

(52) U.S. Cl.
CPC ............... *F21S 2/00* (2013.01); *F21V 5/008* (2013.01); *F21V 5/04* (2013.01); *F21V 7/09* (2013.01);
(Continued)

(58) Field of Classification Search
CPC ........ F21V 7/0025; F21V 7/0083; F21V 9/30; F21V 9/32; F21V 9/38; F21V 9/40
See application file for complete search history.

(56) References Cited

U.S. PATENT DOCUMENTS 3,115,309 A * 12/1963 Spencer ................. F21V 7/005
362/217.06
6,682,207 B2 * 1/2004 Weber ................. H01L 25/0753
257/E25.02
(Continued)

FOREIGN PATENT DOCUMENTS

JP   2012-118302 A   6/2012
JP   2014-041331 A   3/2014
(Continued)

OTHER PUBLICATIONS

International Search Report issued in PCT/JP2016/076442; dated Dec. 13, 2016.
(Continued)

*Primary Examiner* — Ismael Negron
(74) *Attorney, Agent, or Firm* — Studebaker & Brackett PC

(57) ABSTRACT

An illumination device includes a plurality of excitation light sources; a fluorescent plate for receiving the excitation light and emitting fluorescent light; and an optical system for causing excitation light from each of the plurality of excitation light sources to be incident on the fluorescent plate, the optical system includes a plurality of reflection surfaces for redirecting the output from the respective excitation light sources into a divergent light pattern.

4 Claims, 4 Drawing Sheets

(51) Int. Cl.
*F21V 9/30* (2018.01)
*F21V 5/04* (2006.01)
*F21V 7/09* (2006.01)
*F21V 13/00* (2006.01)
*F21V 7/24* (2018.01)
*F21V 9/35* (2018.01)
*G02B 19/00* (2006.01)
*G03B 21/20* (2006.01)
*F21V 5/00* (2018.01)
*H01S 5/00* (2006.01)
*H01S 5/40* (2006.01)

(52) U.S. Cl.
CPC .................. *F21V 7/24* (2018.02); *F21V 9/30* (2018.02); *F21V 9/35* (2018.02); *F21V 13/00* (2013.01); *G02B 19/0014* (2013.01); *G02B 19/0019* (2013.01); *G03B 21/204* (2013.01); *G03B 21/2013* (2013.01); *H01S 5/005* (2013.01); *H01S 5/0071* (2013.01); *H01S 5/4012* (2013.01)

(56) References Cited

U.S. PATENT DOCUMENTS

| | | | |
|---|---|---|---|
| 7,382,091 B2 * | 6/2008 | Chen | H01L 33/507 |
| | | | 257/E33.072 |
| 7,543,959 B2 * | 6/2009 | Bierhuizen | H04N 9/315 |
| | | | 257/98 |
| 8,096,668 B2 * | 1/2012 | Abu-Ageel | G02B 3/0006 |
| | | | 362/296.01 |
| 8,115,217 B2 * | 2/2012 | Duong | H01L 33/20 |
| | | | 257/88 |
| 9,057,493 B2 * | 6/2015 | Simon | F21V 7/0008 |
| 9,249,949 B2 * | 2/2016 | Matsubara | G03B 21/204 |

FOREIGN PATENT DOCUMENTS

| | | |
|---|---|---|
| JP | 5527058 B | 6/2014 |
| WO | 2012/066654 A1 | 5/2012 |
| WO | 2015/122075 A1 | 8/2015 |

OTHER PUBLICATIONS

An Office Action; "Notification of Reasons for Refusal," issued by the Japanese Patent Office dated Jun. 5, 2017, which corresponds to Japanese Patent Application No. 2015-198280.

An Office Action; "Decision of Refusal," issued by the Japanese Patent Office dated Sep. 27, 2017, which corresponds to Japanese Patent Application No. 2015-198280.

An Office Action; "Notification of Reasons for Refusal," issued by the Japanese Patent Office dated Feb. 26, 2018, which corresponds to Japanese Patent Application No. 2015-198280.

* cited by examiner

LIGHTING DEVICE WITH DIVERGENT REFLECTION SURFACES BETWEEN EXCITATION LIGHT SOURCES AND FLUORESCENT PLATE

TECHNICAL FIELD

The present invention relates to a fluorescent light source device. More specifically, the present invention relates to a fluorescent light source device that can be preferably used as, for example, a light source device for a projector apparatus.

BACKGROUND ART

In recent years, a fluorescent light source device has been proposed as a light source device for a projector apparatus (see, for example, Patent Literature 1). The proposed fluorescent light source device has: an excitation light source including a solid light-emitting element, such as a laser diode; and a fluorescent plate that receives excitation light from this excitation light source and outputs fluorescent light.

For example, Patent Literature 1 discloses a fluorescent light source device including: an excitation light-emitting portion whereby excitation light from the excitation light source is converted into and output as collimated light; a transmission-type fluorescent plate that receives the excitation light from the excitation light-emitting portion and outputs fluorescent light; alight condensing optical system that condenses the excitation light from the excitation light-emitting portion on the fluorescent plate; and a collimator optical system that converts fluorescent light from the fluorescent plate into collimated light.

In addition to the light condensing optical system that condenses excitation light, the collimator optical system that converts fluorescent light into collimated light is separately provided to the aforementioned fluorescent light source device. The problem is that it is difficult to reduce the size of the device due to its complicated structure.

A possible means for solving such a problem is to use an optical system that uses a reflective-type fluorescent plate and has both the feature of condensing excitation light and the feature of converting fluorescent light into collimated light.

However, it has been found that such a fluorescent light source device have the following problems:

When a fluorescent material constituting a fluorescent plate receives excitation light, the fluorescent material converts part of its optical energy into thermal energy. Accordingly, when excitation light is excessively condensed and the fluorescent plate is irradiated therewith by the optical system, the temperature of the fluorescent plate rises locally. Temperature quenching thereby occurs to the fluorescent material in the fluorescent plate, which creates difficulty in highly efficiently outputting fluorescent light. In addition, when excitation light is excessively condensed on the fluorescent plate and the fluorescent plate is irradiated therewith, the fluorescent plate deteriorates quickly, and the service life thereof is shortened.

Also, when the focal position of the optical system is moved with respect to the fluorescent plate in the optical axis direction in order to prevent excitation light from being excessively condensed on the fluorescent plate, it is difficult for the optical system to adequately convert fluorescent light output from the fluorescent plate into collimated light. Accordingly, when used as a light source device of a projector apparatus, fluorescent light is not adequately incorporated into a spatial modulating element of the projector apparatus, such as a DMD (Digital Mirror Device). Consequently, achievement of high light utilization efficiency is difficult.

CITATION LIST

Patent Literature

Patent Literature 1: Japanese Patent No. 5527058

SUMMARY OF INVENTION

Technical Problem

The present invention has been made in view of the foregoing circumstances and has as its object the provision of a fluorescent light source device that can highly efficiently emit fluorescent light and can be configured as a compact device with a simple structure.

Also, as another object of the present invention, there is provided a fluorescent light source device that can achieve high utilization efficiency of fluorescent light when it is utilized in a projector apparatus.

Solution to Problem

A fluorescent light source device of the present invention includes:

a plurality of excitation light sources for outputting excitation light;

a fluorescent plate for receiving the excitation light and emitting fluorescent light; and an excitation light incident optical system for causing excitation light from each of the plurality of excitation light sources to be incident into a fluorescent light output surface of the fluorescent plate, wherein the excitation light incident optical system includes a mirror member having a plurality of excitation light reflection surfaces for changing respective travel directions of the excitation light output from the respective excitation light sources, and the excitation light reflected by the plurality of excitation light reflection surfaces is divergent light.

In the excitation light incident optical system of the fluorescent light source device of the present invention, the plurality of excitation light reflection surfaces in the mirror member may preferably be disposed so that a distance between center axes of pencils of rays produced by excitation light reflected by the respective excitation light reflection surfaces is shorter than a distance between optical axes of the corresponding excitation light sources, whereby a distance between center axes of pencils of rays produced by the excitation light output from the respective excitation light sources is shortened.

In the fluorescent light source device of the present invention, the excitation light incident optical system may preferably include a light condensing optical system disposed between the plurality of excitation light sources and the mirror member, and the light condensing optical system may preferably condense excitation light output from each of the plurality of excitation light sources so that each of the plurality of excitation light reflection surfaces in the mirror member is irradiated with the excitation light, whereby the light reflected by the plurality of excitation light reflection surfaces is converted into divergent light.

In the fluorescent light source device of the present invention with this configuration, the light condensing optical system may preferably be constituted by a plurality of light condensing optical members corresponding to the plurality of excitation light reflection surfaces, and an image formation point of the plurality of light condensing optical members may preferably be located on the corresponding excitation light reflection surfaces.

Advantageous Effects of Invention

In the fluorescent light source device of the present invention, the excitation light incident optical system, which causes the excitation light output from each of a plurality of excitation light sources to be incident into the fluorescent light output surface of the fluorescent plate, includes a mirror member having the plurality of excitation light reflection surfaces that convert reflected excitation light into divergent light. Therefore, even when an optical system with the feature of condensing excitation light from the mirror member is disposed between the fluorescent plate and the mirror member so that the focal point is located on the front surface of the fluorescent plate, excitation light output from the plurality of excitation light sources is not excessively condensed on the fluorescent light output surface of the fluorescent plate. Consequently, as a local increase in the temperature of the fluorescent plate is restrained, occurrence of temperature quenching in the fluorescent plate is restrained. Also, a greater degree of design freedom can be afforded in terms of locations where a plurality of excitation light sources are disposed and an excitation light incident optical system. Accordingly, the light source portion constituted by the plurality of excitation light sources and the excitation light incident optical system can be readily made compact.

Therefore, the fluorescent light source device of the present invention may be configured as a compact device with a simple structure that can highly efficiently emit fluorescent light. Also, an optical system with the feature of condensing excitation light from the mirror member and the feature of converting light output from the fluorescent plate into collimated light can be disposed between the mirror member and the fluorescent plate so that the focal point is located on the front surface of the fluorescent plate. When the fluorescent light source device of the present invention is used for a projector apparatus, high utilization efficiency of fluorescent light can be achieved.

DESCRIPTION OF EMBODIMENTS

Hereinbelow, embodiments of a fluorescent light source device of the present invention will be described.

Figure 1:
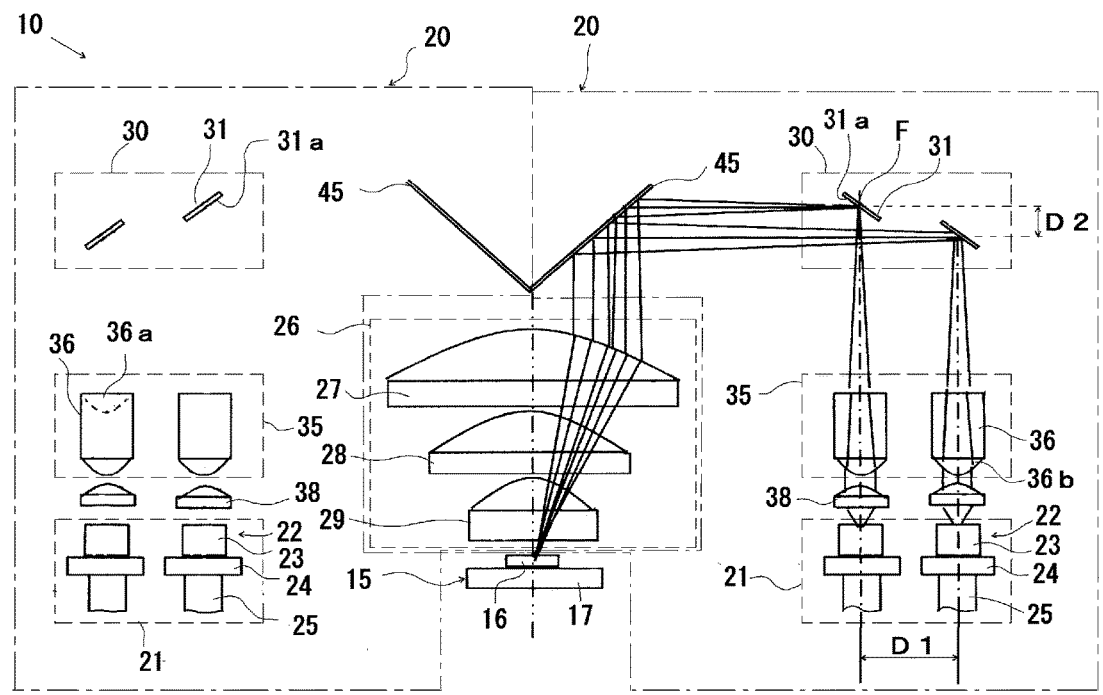
FIG. 1 is an explanatory view illustrating a summary of one example configuration of a fluorescent light source device of the present invention.

FIG. 1 is an explanatory view illustrating a summary of one example configuration of the fluorescent light source device of the present invention.

This fluorescent light source device 10 includes: two excitation light irradiation mechanisms 20; and a fluorescent light-emitting member 15 having a fluorescent plate 16 that receives excitation light from these two excitation light irradiation mechanisms 20 and emits fluorescent light. Each of the two excitation light irradiation mechanisms 20 includes a light source portion 21 including a plurality of (two in the example of the drawing) excitation light sources 22; and an excitation light incident optical system for causing excitation light from this light source portion 21 to be incident into the front surface (upper surface in FIG. 1) of the fluorescent plate 16. The two excitation light irradiation mechanisms 20 are disposed symmetrically with each other over a symmetrical plane (hereinafter, "symmetrical plane of excitation light irradiation mechanisms") which is a plane perpendicular to the front surface of the fluorescent plate 16 which includes the location where the fluorescent light-emitting member 15 is disposed.

In the example of FIG. 1, as described below, the excitation light incident optical system of each of the two excitation light irradiation mechanisms 20 is constituted by: a collimate lens 38; a light condensing optical system 35; a mirror member 30; a dichroic mirror 45; and an optical system 26.

Also, in FIG. 1, an optical path of light (excitation light) output from the plurality of excitation light sources 22 of one excitation light irradiation mechanism 20 is illustrated by a solid line.

The fluorescent light-emitting member 15 is formed by disposing the fluorescent plate 16 in a quadrangle plane shape on the front surface (upper surface in FIG. 1) of a heat dissipation substrate 17 in a quadrangle plane shape.

In this fluorescent light-emitting member 15, the front surface of the fluorescent plate 16 acts as an excitation light incident surface and as a fluorescent light output surface. Specifically, the fluorescent plate 16 is a reflective fluorescent plate where an excitation light incident surface and a fluorescent light output surface are formed on an identical plane. Light output from this fluorescent plate 16 contains fluorescent light and excitation light.

Also, in the fluorescent light-emitting member 15, a reflective film (not illustrated in the drawings) including a silver (Ag) film is disposed so as to extend along the back surface (lower surface in FIG. 1) of the fluorescent plate 16. The fluorescent plate 16 is thus provided with a reflective film and is thereby a reflective plate with a reflective feature on the back surface. Also, a joining member (not illustrated in the drawings) is interposed between the reflective film and the heat dissipation substrate 17, so that the fluorescent plate 16 is joined on the heat dissipation substrate 17 by this joining member. From the viewpoint of heat exhaustion properties, soldering and silver sintering materials, etc. are used as the joining member.

In the example of FIG. 1, the fluorescent plate 16 is in a square plane shape, and the heat dissipation substrate 17 is in a rectangular plane shape.

The fluorescent plate 16 is configured to contain a fluorescent material. The fluorescent material constituting this fluorescent plate 16 is an inorganic fluorescent material and, specifically, comprises an inorganic compound doped with a rare earth element as a light-emitting ion (activator).

As specific examples of the fluorescent materials constituting the fluorescent plate 16, may be mentioned: green fluorescent materials, such as LuAG ($Lu_3Al_5O_{12}$):Ce and YAG ($Y_3Al_5O_{12}$):Pr; red fluorescent materials, such as CASN ($CaAlSiN_3$):Eu, S-CASN ($SrCaAlSiN_3$), YAG ($Y_3Al_5O_{12}$):Sm, and YAG:Pr; and yellow fluorescent materials, such as YAG ($Y_3Al_5O_{12}$):Ce. In the fluorescent plate 16 of this type, the doping amount of activator is approximately 0.5 mol %. Also, these fluorescent materials may be used either singly or in any combination thereof.

Moreover, from the viewpoint of fluorescent light conversion efficiency and heat exhaustion properties, the thickness of the fluorescent plate 16 may preferably be 0.05 to 2.0 mm.

As the heat dissipation substrate 17, a substance comprising a highly heat conductive metal, such as copper, an alloy of copper and molybdenum (Mo—Cu), or an alloy of tungsten and copper (W—Cu), is used.

Moreover, from the viewpoint of heat exhaustion properties, the front surface of the heat dissipation substrate 17, on which the fluorescent plate 16 is disposed, may preferably be greater than the back surface of the fluorescent plate 16 in terms of the vertical and horizontal dimensions and the area.

Also, the thickness of the heat dissipation substrate 17 is, for example, 0.5 to 1.0 mm.

Figure 3:
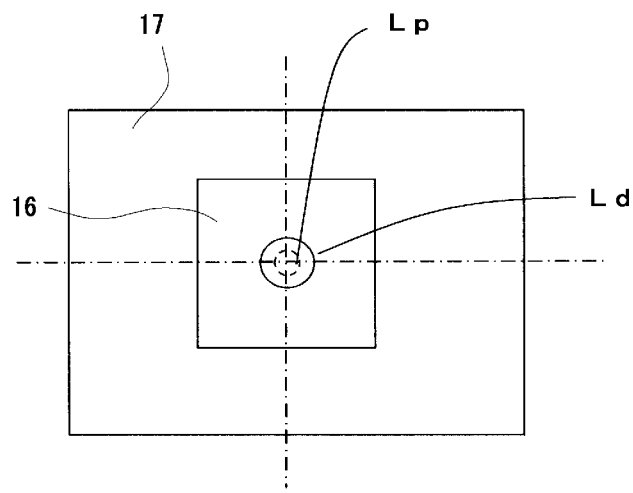
FIG. 3 is an explanatory view illustrating the state of the front surface of a fluorescent light-emitting member in the fluorescent light source device of FIG. 1, when viewed from the direction of an arrow in FIG. 2.

In the example of FIG. 1, the diameter (specifically, the vertical and horizontal dimensions) of the heat dissipation substrate 17 is greater than the diameter (specifically, the vertical and horizontal dimensions) of the fluorescent plate 16 (see FIG. 3). Also, in the heat dissipation substrate 17, the fluorescent plate 16 is disposed at the central portion of the front surface of the heat dissipation substrate 17 (see FIG. 3).

In each of the two excitation light irradiation mechanisms 20, the plurality of excitation light sources 22 constituting the light source portion 21 are arranged in parallel at a location near the lateral sides (specifically, on the right and left sides in FIG. 1) of the fluorescent light-emitting member 15 in the direction perpendicular to the symmetrical plane of excitation light irradiation mechanisms and the peripheral side surfaces (specifically, on the right and left side surfaces in FIG. 1) of the fluorescent light-emitting member 15.

In the example of FIG. 1, each of the plurality of excitation light sources 22 is disposed so that the back surface (lower surface in FIG. 1) of a laser element 23 constituting the excitation light source 22 and the back surface of the fluorescent plate 16 are located on an identical plane.

The excitation light source 22 may be any light source that can emit light as excitation light that can excite a fluorescent material constituting the fluorescent plate 16. Accordingly, an excitation light source that emits light with an appropriate wavelength depending on the type and the like of the fluorescent material constituting the fluorescent plate 16 is used. Specifically, an excitation light source that emits light with a wavelength of, for example, 405 to 465 nm is used.

Also, the excitation light source 22 may be any light source that outputs collimated light or divergent light.

Moreover, as the excitation light source 22, a laser light source including, for example, a laser element is used. The configuration thereof may be those having a single laser light source. An alternative configuration may be those having a plurality of laser light sources and a light condensing lens disposed in front of these laser light sources in the optical axis direction thereof.

In this case, excitation light is not limited to light from a laser light source, but may be light from an LED or from a lamp containing mercury, xenon, or the like sealed therein. When a light source with a wide emission wavelength, such as a lamp or LED, the excitation light wavelength is in the region of the main emission wavelength of light emitted from a lamp, etc. However, the present invention is not limited to these configurations.

In the example of FIG. 1, in each of the plurality of excitation light sources 22, the plurality of laser elements 23 is arranged in parallel in the longitudinal direction of the heat dissipation substrate 24 on the front surface (upper surface in FIG. 1) of the heat dissipation substrate 24. The heat dissipation substrate 24 is in a rectangular plate shape and is elongated in the direction orthogonal to the direction where the plurality of the excitation light sources 22 are arranged in parallel (the direction perpendicular to the sheet surface of FIG. 1). Also, these excitation light sources 22 output divergent light. Moreover, in each of the plurality of excitation light sources 22, a heat dissipation fin 25 is disposed on the back surface (lower surface in FIG. 1) of the heat dissipation substrate 24.

Furthermore, the two excitation light irradiation mechanisms 20 are provided with a commonly used optical system (hereinafter, "common optical system") 26. This common optical system 26 has both the feature of condensing excitation light to be incident into the fluorescent plate 16 and the feature of converting fluorescent light output from the fluorescent plate 16 into collimated light.

Also, the common optical system 26 is disposed at a location near the fluorescent light-emitting member 15 on the optical path along which excitation light travels from the light source portion 21 and reaches the fluorescent light-emitting member 15 (specifically, the optical path along which excitation light travels from the light source portion 21 in one excitation light irradiation mechanism 20 and reaches the fluorescent light-emitting member 15 and the optical path along which excitation light travels from the light source portion 21 in the other excitation light irradiation mechanism 20 and reaches the fluorescent light-emitting member 15).

The common optical system 26 is constituted by, for example, a convex lens and is disposed so that the focal point of the common optical system 26 is located on the front surface of the fluorescent plate 16. As the common optical system 26 is disposed so that the focal point thereof is located on the front surface of the fluorescent plate 16, the common optical system 26 serves as a light condensing lens system for light incident from the excitation light source side (upper surface side in FIG. 1). On the other hand, the common optical system 26 serves as a collimate lens system for light incident from the fluorescent light-emitting member side (lower surface side in FIG. 1).

In the example of FIG. 1, the common optical system 26 is constituted by a plurality of convex lenses, specifically, a first convex lens 27, a second convex lens 28 and a third convex lens 29. These convex lenses are disposed on the symmetrical plane of excitation light irradiation mechanisms so that the optical axes of the lenses are located on an identical axis. Also, the common optical axis of the first convex lens 27, the second convex lens 28, and the third convex lens 29, specifically, the optical axis of the common optical system 26, is contained in the symmetrical plane of excitation light irradiation mechanisms.

Moreover, in FIG. 1, the optical axis of the common optical system 26 is indicated by a two-dot chain line.

Furthermore, the excitation light incident optical system includes a mirror member 30 having a plurality of (two in the example of the drawing) excitation light reflection surfaces 31a that each change the travel direction of excitation light output from each of the plurality of excitation light sources 22. In this mirror member 30, excitation light whose travel direction has been changed by each of the plurality of excitation light reflection surfaces 31a, i.e., the reflected excitation light is divergent light.

In the example of FIG. 1, the mirror member 30 has a plurality of turning mirrors 31, and the excitation light reflection surface 31a is formed by each of the reflection surfaces of these turning mirrors 31. The plurality of turning mirrors 31 are in a rectangular plate shape and are elongated in the direction perpendicular to the sheet surface of FIG. 1.

As the mirror member 30 is disposed on the excitation light incident optical system, the degree of freedom in terms of the locations of the plurality of excitation light sources 22 increases, whereby the degree of design freedom in the light source portion 21 increases. Accordingly, as illustrated in FIG. 1, the plurality of excitation light sources 22 can be disposed at a location near the lateral side of the fluorescent light-emitting member 15. Consequently, as the dimensions of the plurality of excitation light sources 22 can be decreased in the optical axis direction (vertical direction in FIG. 1) in the fluorescent light source device 10, the fluorescent light source device 10 can be made compact. Also, since the excitation light source 22 (laser element 23) and the fluorescent light-emitting member 15 (fluorescent plate 16) can be cooled by a common cooling mechanism, the fluorescent light source device 10 can be further made compact.

Moreover, as excitation light reflected by each of the plurality of excitation light reflection surfaces 31a is divergent light, excitation light is not excessively condensed on the front surface of the fluorescent plate 16. Thereby, the front surface of the fluorescent plate 16 can be prevented from being irradiated with excitation light at a high energy density.

Specifically, the common optical system 26 is disposed in the fluorescent light source device 10 so that the focal point is located on the front surface of the fluorescent plate 16. Thereby, the feature of condensing excitation light to be incident into the fluorescent plate 16 and the feature of converting light output from the fluorescent plate 16 into collimated light are simultaneously provided to the common optical system 26. Therefore, as indicated by the dashed line in FIG. 2, when the excitation light made incident into the common optical system 26 (see FIG. 1) is parallel light Lp, the light is condensed by the common optical system 26. The excitation light (parallel light Lp) output from the third convex lens 29 is excessively condensed at the focal position of the common optical system 26 on the front surface of the fluorescent plate 16. Specifically, the light condensing point of the excitation light (parallel light Lp) from the common optical system 26 is located on the front surface of the fluorescent plate 16. However, as illustrated by the solid line in FIG. 2, the excitation light made incident into the common optical system 26 (see FIG. 1) is converted into divergent light Ld. In this case, the excitation light (divergent light Ld) condensed by the common optical system 26 and output from the third convex lens 29 is not excessively condensed at the focal position of the common optical system 26 on the front surface of the fluorescent plate 16. When the excitation light made incident into the common optical system 26 is the divergent light Ld, the light condensing point of the excitation light (divergent light Ld) in the common optical system 26 is usually located in front of the location of the front surface of the fluorescent plate 16 in the optical axis direction of the common optical system 26 (on the lower side in FIG. 2). Consequently, the excitation light (divergent light Ld) is not excessively condensed on the front surface of the fluorescent plate 16 by the common optical system 26. Accordingly, as illustrated in FIG. 3, the incidence region of excitation light on the front surface of the fluorescent plate 16 is greater when the excitation light made incident into the common optical system 26 is the divergent light (Ld) than when the excitation light made incident into the common optical system 26 is the parallel light Lp.

Figure 2:
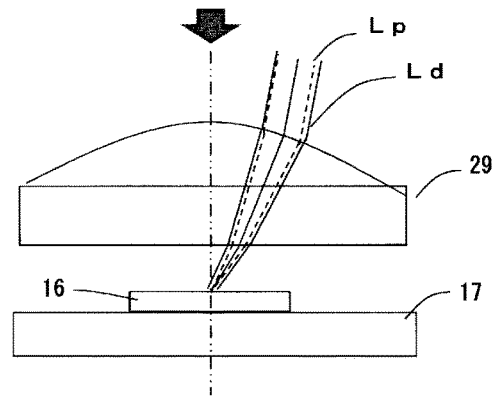
FIG. 2 is an explanatory view illustrating the state in the fluorescent light source device of FIG. 1 where excitation light condensed by a third convex lens is made incident into a fluorescent plate.

In FIG. 2, the optical axis of the third convex lens 29 (the optical axis of the common optical system 26) is indicated by a two-dot chain line.

Also, in FIG. 3, the solid line indicates the boundary of the excitation light incidence region formed on the front surface of the fluorescent plate 16 when excitation light made incident into the common optical system 26 is the divergent light Ld. On the other hand, the dashed line indicates the boundary of the excitation light incidence region formed on the front surface of the fluorescent plate 16 when the excitation light made incident into the common optical system 26 is the parallel light Lp.

In the mirror member 30, each of the plurality of turning mirrors 31 is inclined with respect to the optical axis of the excitation light source 22, which corresponds to the excitation light reflection surface 31a, so that the excitation light reflection surface 31a faces to the corresponding excitation light source 22.

Also, in the mirror member 30, as illustrated in FIG. 1, the plurality of turning mirrors 31 may preferably be arranged in a stepwise manner corresponding to a row of the plurality of excitation light sources 22 that are arranged in parallel.

By arranging the plurality of turning mirrors 31 in a stepwise manner corresponding to the row of the plurality of excitation light sources 22, the mirror member 30 can be made compact.

Specifically, by arranging the plurality of turning mirrors 31 in a stepwise manner, the distance between the center axes of pencils of rays produced by excitation light output from the respective excitation light sources 22 can be shortened. Specifically, the plurality of turning mirrors 31 of the mirror member 30 may be disposed so that a distance D2 between the center axes of pencils of rays (hereinafter, "pencil of rays center distance") produced by excitation light reflected by the respective excitation light reflection surfaces 31a is made shorter than a distance D1 between the optical axes of the corresponding excitation light sources 22. Consequently, the dimensions of the mirror member 30 in the optical axis direction (vertical direction in FIG. 1) of the excitation light source 22 can be made smaller.

In this case, the pencil of rays center distance D2 is the distance between the center axes of pencils of rays (hereinafter, "pencil of rays center axis") produced by excitation light reflected by the respective excitation light reflection surfaces 31a that are adjacent to each other. Also, the distance D1 between optical axes is the distance between the optical axes of the excitation light sources 22 that are adjacent to each other.

In the example of FIG. 1, of the plurality of turning mirrors 31, one of the adjacent turning mirrors 31 corresponding to the excitation light source 22 that is located more separately from the fluorescent light-emitting member 15 is closer to the excitation light source 22. Also, the plurality of turning mirrors 31 are disposed so that the pencil of rays center axes of the excitation light reflection surfaces 31a are parallel with each other.

Also, as illustrated in FIG. 1, in the excitation light incident optical system, the light condensing optical system 35 may preferably be disposed at a location near the light source portion 21 between the light source portion 21 and the mirror member 30. This light condensing optical system 35 has the light condensing feature whereby excitation light output from each of the plurality of excitation light sources 22 constituting the light source portion 21 is condensed and made incident into each corresponding excitation light reflection surface 31a.

Specifically, the light condensing optical system 35 is constituted by a plurality of light condensing lenses 36. These light condensing lenses 36 are disposed corresponding to the respective excitation light reflection surfaces 31a of the mirror member 30. Specifically, between one of the plurality of excitation light sources 22 and the turning mirror 31 corresponding to each of the plurality of the excitation light sources 22, the light condensing lens 36 is disposed at a location near the excitation light source 22.

In the example of FIG. 1, each of the plurality of light condensing lenses 36 constituting the light condensing optical system 35 is disposed so that the optical axis of the light condensing lens 36 coincides with that of the corresponding excitation light source 22. Also, the collimate lens 38 is disposed between each of the plurality of excitation light sources 22 and each of the plurality of light condensing lenses 36. Each of these collimate lenses 38 is disposed so that the optical axis of the collimate lens 38 coincides with those of the corresponding excitation light source 22 and the light condensing lens 36.

By disposing the light condensing optical system 35 between the light source portion 21 and the mirror member 30, excitation light reflected by each of the plurality of excitation light reflection surfaces 31a is converted into divergent light.

Also, by disposing the light condensing optical system 35 between the light source portion 21 and the mirror member 30, excitation light output from each of the plurality of excitation light sources 22 is condensed and made incident into each of the plurality of excitation light reflection surfaces 31a of the mirror member 30. Therefore, as the excitation light incidence region on the excitation light reflection surface 31a is made smaller, the area of the excitation light reflection surface 31a can be reduced. Also, by reducing the area of the excitation light reflection surface 31a, the plurality of turning mirrors 31 constituting the mirror member 30 can be disposed so as to be close to each other in the direction (vertical direction in FIG. 1) perpendicular to the pencil of rays center axis of the excitation light reflection surface 31a. Specifically, the pencil of rays center distance D2 between the plurality of excitation light reflection surfaces 31a can be shortened. Thus, the plurality of turning mirrors 31 can be disposed so that the pencil of rays center distance D2 is made shorter than the distance D1 between the optical axes of the corresponding excitation light sources 22. Specifically, the distance between the center axes of pencils of rays produced by excitation light output from the respective excitation light sources 22 can be further shortened. Consequently, as the mirror member 30 can be made more compact, the fluorescent light source device 10 can be made further compact. Also, as the excitation light output from the plurality of excitation light sources 22 can be made incident into the common optical system 26 at a location near the central portion (optical axis near location) of the excitation light incident surface (upper surface in FIG. 1) of the first convex lens 27, the efficiency of incidence of excitation light into the fluorescent plate 16 can be enhanced. Consequently, by disposing the light condensing optical system 35 between the light source portion 21 and the mirror member 30, excitation light output from the excitation light source 22 can be used highly efficiently.

The image formation point of each of the plurality of light condensing lenses 36 constituting the light condensing optical system 35 is preferably located on the corresponding excitation light reflection surface 31a. In this case, the image formation point of the light condensing lens 36 coincides with the focal point F of the light condensing lens 36 when excitation light made incident into the light condensing lens 36 is parallel light.

The phrase "the image formation point of a light condensing lens is located on the corresponding excitation light reflection surface" used herein refers to a concept including a case where the image formation point of a light condensing lens is located at a location near the excitation light reflection surface in the optical axis direction of the light condensing lens. Specifically, this means that the image formation point of the light condensing lens 36 is substantially located on the corresponding excitation light reflection surface.

In the example of FIG. 1, the image formation point of the plurality of light condensing lenses 36 constituting the light condensing optical system 35 is located on the excitation light reflection surface 31a. Alternatively, the image formation point is located at a location near the excitation light reflection surface 31a in the optical axis direction of the light condensing lens 36. Specifically, the image formation point of the plurality of light condensing lenses 36 is substantially located on the corresponding excitation light reflection surface 31a. Also, the image formation point of the light condensing lens 36 coincides with the focal point F of the light condensing lens 36.

As the image formation point of the light condensing lens 36 is located on the corresponding excitation light reflection surface 31a, excitation light condensed by the light condensing lens 36 is condensed at the location of the image formation point of the light condensing lens 36 on the excitation light reflection surface 31a. Specifically, the light condensing point of excitation light of the light condensing lens 36 is located on the excitation light reflection surface 31a. Therefore, as the excitation light incidence region on the excitation light reflection surface 31a is extremely small, the fluorescent light source device 10 can be made further compact, and the efficiency of incidence of excitation light into the fluorescent plate 16 can be further increased.

Figure 4:
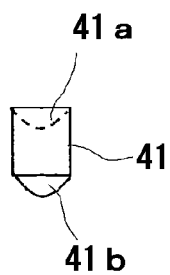
FIG. 4 is an explanatory view illustrating a first concrete example of a light condensing lens constituting the fluorescent light source device of the present invention.
Figure 5:
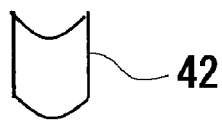
FIG. 5 is an explanatory view illustrating a second concrete example of the light condensing lens constituting the fluorescent light source device of the present invention.
Figure 6:
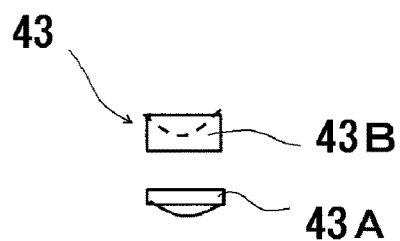
FIG. 6 is an explanatory view illustrating a third concrete example of the light condensing lens constituting the fluorescent light source device of the present invention.
Figure 7:
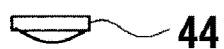
FIG. 7 is an explanatory view illustrating a fourth concrete example of the light condensing lens constituting the fluorescent light source device of the present invention.

As concrete examples of the light condensing lens 36, may be mentioned a circular cylinder lens 41 illustrated in FIG. 4, a cylindrical lens 42 illustrated in FIG. 5, a complex lens 43, illustrated in FIG. 6, produced by combining a plano-convex lens 43A and plano-concave lens 43B and a plano-convex lens 44 illustrated in FIG. 7. In this case, the circular cylinder lens 41 has a recessed portion 41a at one end and a protrusion portion 41b at the other end.

In the fluorescent light source device 10 of FIG. 1, the light condensing lens 36 is constituted by a circular cylinder lens having a recessed portion 36a at one end and a protrusion portion 36b at the other end.

Also, in the excitation light incident optical system, the dichroic mirror 45 is disposed between the mirror member 30 and the common optical system 26. This dichroic mirror 45 is disposed so as to be inclined with respect to the optical axis of the common optical system 26 and the pencil of rays center axis of the plurality of excitation light reflection surfaces 31a so that the dichroic mirror 45 faces to the front surface of the fluorescent plate 16 via the plurality of excitation light reflection surfaces 31a of the mirror member 30 and the common optical system 26. Also, the dichroic mirror 45 reflects excitation light from the light source portion 21 and transmits fluorescent light from the fluorescent plate 16.

In the fluorescent light source device 10 having the aforementioned configuration, by simultaneously turning on the plurality of excitation light sources 22, excitation light is output in a forward direction from the plurality of excitation light sources 22 in the optical axis direction of the excitation light source 22 (upward direction in FIG. 1). The excitation light output from each of the plurality of excitation light sources 22 is made incident into and reflected by each of the plurality of excitation light reflection surfaces 31a via the collimate lens 38 and the light condensing lens 36, whereby the travel direction thereof is changed and the excitation light travels toward the dichroic mirror 45. Then, the travel direction of the excitation light made incident into the dichroic mirror 45 is changed since the excitation light is reflected by the dichroic mirror 45. Thereafter, the excitation light is condensed by the common optical system 26. The front surface (excitation light incident surface) of the fluorescent plate 16 is irradiated with the condensed light, which is in turn made incident into the fluorescent plate 16. In this fluorescent plate 16, when a fluorescent material is excited, fluorescent light is emitted from the fluorescent plate 16. This fluorescent light is output to outside from the front surface (fluorescent light output surface) of the fluorescent plate 16 together with excitation light not absorbed into the fluorescent material and is reflected on the back surface of the fluorescent plate 16. The light thus output from the front surface (fluorescent light output surface) of the fluorescent plate 16 is converted into parallel light by the common optical system 26. Only the light having been transmitted through the dichroic mirror 45, in other words, fluorescent light, is output to outside of the fluorescent light source device 10.

Also, in the fluorescent light source device 10, the excitation light incident optical system is configured to include the mirror member 30. Accordingly, the excitation light output from the plurality of excitation light sources 22 is condensed and made incident into the fluorescent plate 16 by the common optical system 26, which is disposed so that the focal point is located on the front surface of the fluorescent plate 16. However, the aforementioned excitation light is not excessively condensed on the front surface (excitation light incident surface) of the fluorescent plate 16. Consequently, as a local increase in the temperature of the fluorescent plate 16 is restrained, occurrence of temperature quenching in the fluorescent plate 16 is restrained.

Also, in the fluorescent light source device 10, by adjusting the location where the turning mirror 31 (excitation light reflection surface 31a) is disposed in the mirror member 30, the distance between the center axes of pencils of rays produced by excitation light output from the respective excitation light sources 22 can be shortened, and the efficiency of incidence of excitation light into the fluorescent plate 16 can thereby be enhanced. Accordingly, fluorescent light can be acquired by effectively utilizing the excitation light output from the plurality of excitation light sources 22. Specifically, for example, the efficiency of incidence of excitation light in the foregoing can be higher than the efficiency of the excitation light incident optical system where a diffusion plate is included in place of the mirror member 30.

Therefore, fluorescent light can be emitted highly efficiently by the fluorescent light source device 10.

Also, as the florescent light source device 10 is provided with the mirror member 30, a large degree of design freedom can be afforded in terms of the locations of a plurality of excitation light sources 22 and the excitation light incident optical system. The light source portion 21 and the excitation light incident optical system can be readily made compact. In addition, the fluorescent plate 16 is made as a reflective type. The excitation light incident optical system is configured to include the common optical system 26 that has both the feature of condensing excitation light to be incident into the fluorescent plate 16 and the feature of converting light output from the fluorescent plate 16 into parallel light. Thereby, an optical system with the feature of condensing excitation light to be incident into the fluorescent plate 16 and an optical system with the feature of converting light output from the fluorescent plate 16 into parallel light do not need to be provided separately.

Therefore, the fluorescent light source device 10 can be designed as a compact device with a simple configuration.

Furthermore, by shortening the distance between the center axes of pencils of rays of excitation light output from the respective excitation light sources 22, the fluorescent light source device 10 is further made compact, and the efficiency of incidence of excitation light into the fluorescent plate 16 is enhanced.

In this case, in the fluorescent light source device 10 is compact. The dimension of fluorescent light source device 10 in the optical axis direction (vertical direction in FIG. 1) of the common optical system 26 is 90 mm, and the dimension in the direction perpendicular to the optical axis (horizontal direction in FIG. 1) is 200 mm.

Also, fluorescent light output from the fluorescent plate 16 is sufficiently converted into parallel light by the common optical system 26 as the focal point of the common optical system 26 is located on the front surface of the fluorescent plate 16. Accordingly, the utilization rate of fluorescent light is high when the fluorescent light source device 10 is used as a light source device for a projector apparatus.

As above, the fluorescent light source device of the present invention has been described with reference to the concrete examples, but the present invention is not limited thereto.

Figure 8:
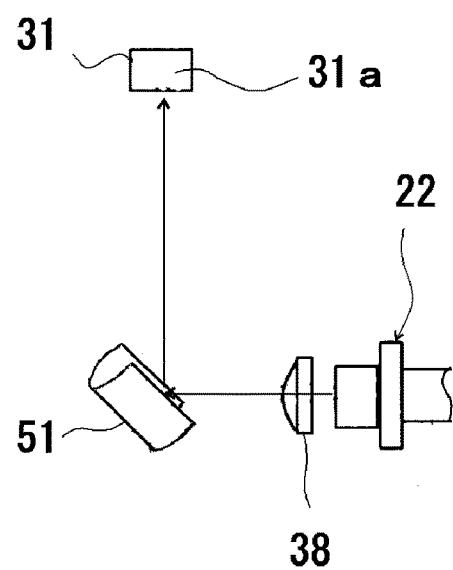
FIG. 8 is an explanatory view illustrating, together with an excitation light source and a turning mirror, a light condensing optical member constituting the fluorescent light source device of the present invention.

For example, the plurality of light condensing optical members constituting the light condensing optical system are not limited to a light condensing lens. Various types of light condensing optical members can be used as long as they have the feature of condensing excitation light output from the excitation light source. Specifically, as illustrated in FIG. 8, for example, a concave mirror 51, etc. can be used as the light condensing optical member. This concave mirror 51 is disposed so that the reflection surface of the concave mirror 51 faces to the excitation light source 22 and the excitation light reflection surface 31a in the turning mirror 31. The configuration of the fluorescent light source device including this concave mirror 51 is identical to that of the fluorescent light source device 10 of FIG. 1 except that the concave mirror 51 is used as the light condensing optical member, and the plurality of excitation light sources 22 are disposed at different locations.

In FIG. 8, the travel direction of excitation light output from the excitation light source 22 is indicated by an arrow.

Figure 9:
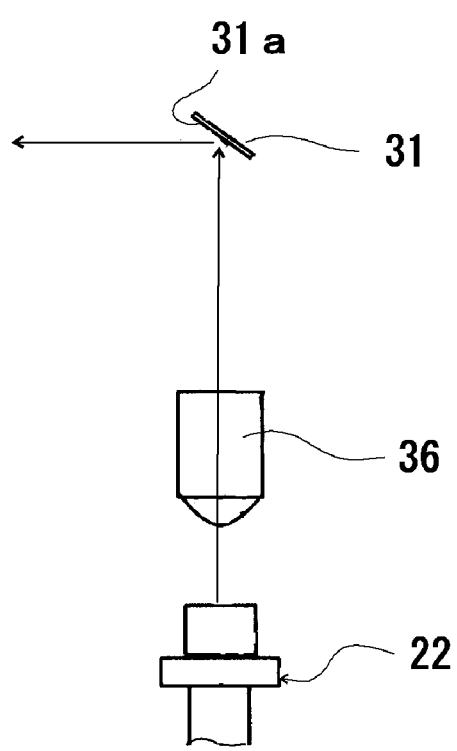
FIG. 9 is an explanatory view illustrating main portions of another example configuration of the fluorescent light source device of the present invention.

Also, the excitation light incident optical system may be any type as long as the optical system includes a mirror member and light reflected by a plurality of excitation light reflection surfaces constituting the mirror member is divergent light. The entire structure of the excitation light incident optical system is not limited to the configuration illustrated in FIG. 1, and various configurations may be adopted. Specifically, as illustrated in FIG. 9, the configuration of the excitation light incident optical system may be identical to that of the excitation light incident optical system of FIG. 1 where a collimate lens is not disposed between a plurality of excitation light sources and the light condensing optical system. The configuration of the fluorescent light source device including this excitation light incident optical system is identical to that of the fluorescent light source device 10 of FIG. 1 except that a collimate lens is not provided.

In FIG. 9, the travel direction of the excitation light output from the excitation light source 22 is indicated by an arrow.

Also, a fluorescent light source device may be configured so that light output to outside of the fluorescent light source device is made incident into a fluorescent plate together with fluorescent light and contains excitation light that is not absorbed into a fluorescent material and is reflected on the back surface of the fluorescent plate. In a concrete example of a fluorescent light source device with this type of configuration, a mirror member using polarization properties in place of the dichroic mirror 45 is used in the fluorescent light source device 10 of FIG. 1. In this mirror member utilizing polarization properties, a dielectric multilayer film is formed in a stripe shape, and a multilayer anti-reflection film is formed in a region where the dielectric multilayer film is not formed. In this mirror member, a dichroic mirror is constituted by the dielectric multilayer film.

Also, on the front surface of the fluorescent plate, a periodic structure where a plurality of protrusion portions are periodically arranged may be formed. In this case, the periodic structure of the front surface of the fluorescent plate is formed by periodically and two-dimensionally arranging protrusion portions, for example, in a substantially conical shape (specifically, a cone or frustum shape) while they are densely provided.

REFERENCE SIGNS LIST 10 fluorescent light source device
15 fluorescent light-emitting member
16 fluorescent plate
17 heat dissipation substrate
20 excitation light irradiation mechanism
21 light source portion
22 excitation light source
23 laser element
24 heat dissipation substrate
25 heat dissipation fin
26 optical system (common optical system)
27 first convex lens
28 second convex lens
29 third convex lens
30 mirror member
31 turning mirror
31a excitation light reflection surface
35 light condensing optical system
36 light condensing lens
36a recessed portion
36b protrusion portion
38 collimate lens
41 circular cylinder lens
41a recessed portion
41b protrusion portion
42 cylindrical lens
43 complex lens
43A plano-convex lens
43B plano-concave lens
44 plano-convex lens
45 dichroic mirror
51 concave mirror

The invention claimed is:

1. A fluorescent light source device comprising:
a plurality of excitation light sources for outputting excitation light;
a fluorescent plate for receiving the excitation light and emitting fluorescent light; and
an optical system having a mirror member with a plurality of reflecting surfaces for receiving excitation light and outputting divergent excitation light, the optical system directing excitation light to be incident on a surface of the fluorescent plate.

2. The fluorescent light source device according to claim 1, wherein the plurality of reflection surfaces are disposed so that a distance between center axes of light cones outputted by the respective reflection surfaces is shorter than a distance between optical axes of the corresponding excitation light sources.

3. The fluorescent light source device according to claim 1,
the optical system further including a light condensing optical system disposed between the plurality of light sources and the mirror member, wherein
the light condensing optical system condenses light from each of the plurality of light sources onto each of the plurality of reflection surfaces.

4. The fluorescent light source device according to claim 3, wherein
the light condensing optical system includes a plurality of light condensing optical members corresponding to the plurality of reflection surfaces, and
a focal point of the plurality of light condensing optical members is located on the corresponding reflection surfaces.

* * * * *